US007116788B1

(12) United States Patent
Chen et al.

(10) Patent No.: US 7,116,788 B1
(45) Date of Patent: Oct. 3, 2006

(54) EFFICIENT HEAD RELATED TRANSFER FUNCTION FILTER GENERATION

(75) Inventors: Paul Chen, Costa Mesa, CA (US); Harry Lau, Norwalk, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 935 days.

(21) Appl. No.: 10/054,359

(22) Filed: Jan. 17, 2002

(51) Int. Cl.
*H04R 5/00* (2006.01)
*H04R 5/02* (2006.01)
*H03G 3/00* (2006.01)

(52) U.S. Cl. .......................... 381/17; 381/310; 381/61

(58) Field of Classification Search ..................... None
See application file for complete search history.

(56) References Cited

U.S. PATENT DOCUMENTS 5,715,317 A * 2/1998 Nakazawa .................. 381/17
5,742,689 A * 4/1998 Tucker et al. ................. 381/17
5,757,931 A * 5/1998 Yamada et al. ............... 381/61
5,862,227 A * 1/1999 Orduna-Bustamante et al. . 381/17
6,181,800 B1 * 1/2001 Lambrecht .................. 381/310
6,768,798 B1 * 7/2004 Dempsey ..................... 381/17
6,947,569 B1 * 9/2005 Yamada et al. ............. 381/310
6,990,205 B1 * 1/2006 Chen ........................... 381/17

* cited by examiner

*Primary Examiner*—Laura A. Grier
(74) *Attorney, Agent, or Firm*—Farjami & Farjami LLP

(57) ABSTRACT

A method for generating a head related transfer function comprises downconverting each of a plurality of measured impulse responses from a first sampling frequency to a second sampling frequency and then converting each downconverted impulse responses to a set of head related transfer functions. Coordinate conversion can then be performed on each set of head related transfer functions. The converted sets of head related transfer functions are then averaged to generate one average head related transfer function. The average head related transfer function can be decimated to fit a filter engine of a target system.

14 Claims, 3 Drawing Sheets

EFFICIENT HEAD RELATED TRANSFER FUNCTION FILTER GENERATION

BACKGROUND

1. Technical Field

The present invention relates generally to 3D sound systems and, more particularly, it relates to systems and methods for use in the efficient generation of Head Related Transfer Functions (HRTFs).

2. Related Art 3D sound, or spatial sound, is becoming more and more common, e.g., in the generation of sound tracks for animated films and computer games. In order to understand 3D sound, it is important to distinguish it from monaural sound, stereo sound, and binaural sound. Monaural sound is sound that is recorded using one microphone. Because it is recorded using one microphone, the listener does not receive any sense of sound positioning when listening to monaural sound.

Stereo sound is recorded with two microphones several feet apart separated by empty space. When stereo sound is played back to a listener, the recording from one microphone goes in the left ear and the recording from the other microphone goes in the right ear. As a result of how the sound is recorded, i.e., two microphones separated by empty space, the listener often perceives that the sound is coming form a location within the listeners head. This is because humans do not normally hear sounds in the manner they are recorded in stereo audio recording and, therefore, the listener's head is acting as a filter to the incoming sound.

Binaural sound recordings, on the other hand, are more realistic from the human listener's point of view, because they are recorded in a manner that more closely resembles the human acoustic system. Binaural recordings are made with microphones embedded in a model human head. Such recordings yield sound that appears to be external to the listeners head, because the model head filters sound in a manner similar to a real human head.

3D sound takes the binaural approach one step further. 3D sound recordings are made with microphones in the ears of an actual person. These recordings are then compared with the original sounds to compute the person's HRTF. The HRTF is a linear function that is based on the sound source's position and takes into account many cues humans use to localize sounds. The HRTF is then used to develop coefficients for a Finite Impulse Response (FIR) filter pair (one for each ear) for each sound position within a particular sound environment. Thus, to place a sound at a certain position within a given sound environment, the set of FIR filters that corresponds to the position is applied to the incoming sound. This is how 3D or spatial sound is generated.

To fully understand 3D sound generation, a more complete understanding of the HRTF is required. To accurately synthesize a sound source with all the physical cues and source localization that it encompasses, the sound pressure that the source makes on the ear drum must be found. Thus, the impulse response h(t) from the source to the ear drum must be found. Such an impulse response h(t) is referred to as the Head-Related-Impulse-Response (HRIR), the Fourier transform H(f) of which is the HRTF. Once you know the HRTF for the left ear and the right ear, you can synthesize the 3D sound source accurately.

The HRTF is a complex function of three space coordinate variables and one frequency variable. But in spherical coordinates, for distances greater than approximately on meter, the source is said to be in the far field. In the far field, HRTF measurements fall off inversely with range. Thus, for HRTF measurements made in the far field, the HRTF is essentially reduced to a function of azimuth, elevation, and frequency.

Systems based on HRTFs are able to produce elevation and range effects as well as azimuth effects. Thus, such systems can create the impression of sound being at any desired 3D location within a given sound environment. This is done by filtering the sound source through a pair of filters corresponding to the HRTF pair, i.e., left and right ear HRTFs, for the given location. Therefore, in conventional HRTF systems, tables of filter coefficients are stored corresponding to HRTFs for different locations within the sound environment. The appropriate coefficients are then retrieved and applied to a pair of FIR filters through which an incoming sound is filtered before reaching the listener.

Several problems exist with such systems. For example, an infinite number of filter coefficients for an infinite number of HRTFs cannot feasibly be stored in 3D sound systems. Thus, a tradeoff must be made between the quality of the 3D sound and the number of coefficients used, i.e., the size of the FIR filters, as well as the number of HRTFs stored. Another problem relates to how the HRTFs are generated. Typically, the HRTFs will be generated from a sample group of individuals. Thus, a certain number of HRTF measurements will be made for the group. The HRTF measurements for the group will be converted into a certain number of coefficients. For example, Raw data for each member of the group may be taken every 10° along the azimuth plane from 180° to −180° and along the elevation plane in 10° increments from 80° to −80°.

This raw data may need to be converted or reduced, however, for a given sound environment in a given 3D sound system. For example, a given 3D sound system may use filter mapping that extends from 180° to −180° using 30° increments in the azimuth plane and from 54° to −36° using 18° increments in the elevation plane. Such a filter mapping may be required, for example, due to the nature of the sound environment or due to system limitation, such as limited memory to store the filter maps.

Therefore, the problem presented is how to take HRTF measurements for y-number of people that results in x-coefficients and convert them into one filter set with z-coefficients and have the set of z-coefficients be good enough to produce accurate, quality 3D sound for a general population? Present 3D sound systems incorporate the ability to perform such conversions into the system by incorporating the ability to perform complex signal processing. In fact, some systems include a separate dedicated DSP for performing the complex signal processing that is required. Unfortunately, this not only drives up the cost of such systems, the required signal processing also drives up the computational overhead of the system, resulting in an excessive amount of time to perform the required computations.

To reduce the amount of time and computational overhead required, some systems use data compression techniques. Such techniques, however, are inherently lossy and, therefore, result in poorer sound reproduction. In particular, the phase relationship between left and right ear signals can be greatly effected do to the lossy nature of compression techniques.

SUMMARY OF THE INVENTION

The systems and methods described herein address the problems discussed above by providing for the efficient generation of HRTFs. In one aspect of the invention, a method for generating a head related transfer function comprises downconverting each of a plurality of measured impulse responses from a first sampling frequency to a second sampling frequency and then converting each downconverted impulse responses to a set of head related transfer functions. Coordinate conversion can then be performed on each set of head related transfer functions. The converted sets of head related transfer functions are then averaged to generate one average head related transfer function. The average head related transfer function can be decimated to fit a filter engine of a target system.

The method described can be fine tuned to ensure that it generates an HRTF that can be used for an entire target population, without the need for costly, time consuming signal processing. Further, such a method can be implemented in software so that it is not hardware resource intensive or specific, which provides further benefits as described herein.

Other aspects, advantages and novel features of the present invention will become apparent from the following detailed description of the invention when considered in conjunction with the accompanying drawings.

BRIEF DESCRIPTION OF THE DRAWINGS

A better understanding of the present invention can be obtained when the following detailed description of various exemplary embodiments are considered in conjunction with the following drawings.

DETAILED DESCRIPTION OF THE INVENTION

In order to decrease the computational overhead required to generate adequate HRTF coefficients from a set of raw data coefficients, the systems and methods described herein start with the actual conversion and averaging of the raw data coefficients. Efficient HRTF generation is achieved by performing these steps so as to generate a set of coefficients that can be used for a general population without the need for complex signal processing as in current 3D sound systems.

Figure 1:
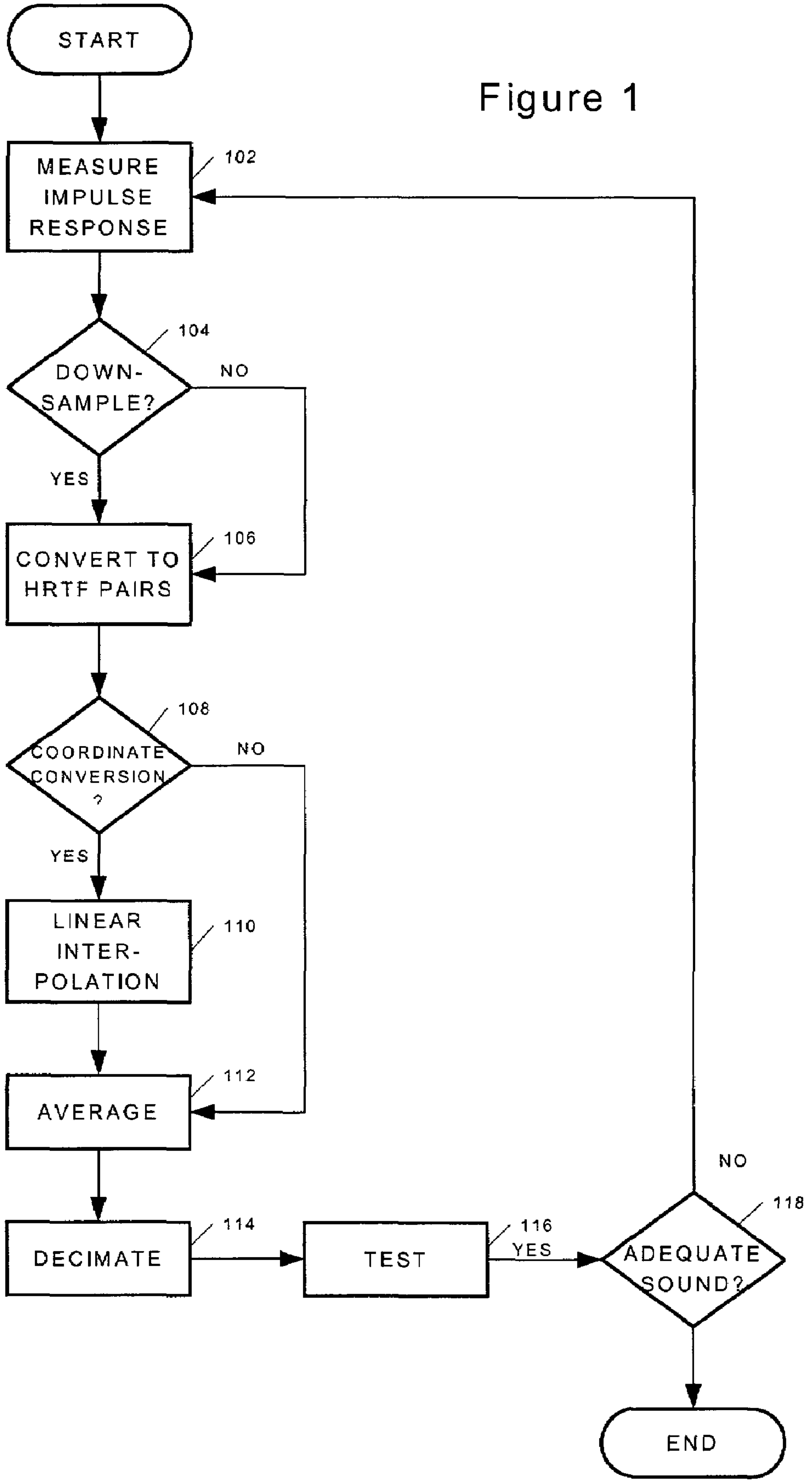
FIG. 1 is a flow chart illustrating an example method of generating an HRTF in accordance with the invention.

FIG. 1 is a flow chart illustrating a process by which such efficient HRTF generation can be achieved. First, in step 102, the impulse responses are measured for each individual in a sample group. The impulses are measured by taking samples of a certain length, e.g., 16 bits, and at a certain rate, e.g., 50 khz. Thus, each impulse will comprise a certain number of samples, each sample comprising a certain length. For example, a commonly available set of impulses are 512 samples in length, sampled at 16 bit, 50 khz resolution.

Due to limitations of the target 3D sound system, the impulses may need to be downsampled, e.g., from 50 Khz to a lower frequency such as 44.1 Khz. This is illustrated by step 104 in FIG. 1. Downsampling will reduce the length of the measured impulses from 512 samples, for example, to something smaller.

Next, in step 106, the impulse responses are converted to HRTF pairs. The HRTF pairs are generated for certain predefined positions. For example, the samples can be taken at certain intervals in the azimuth plain and certain intervals in the elevational plane for different ranges and angles. Sampling in this fashion effectively divides the environment into a grid, with each sampling position corresponding to a grid point. As mentioned previously, the grid can comprise sampling positions from 180° to −180° in 10° increments in the azimuth plane and from 80° to −80° in 10° increments in the elevational plane. Thus, in this manner, HRTF pairs are generated for each grid position.

The coordinate grid used to generate the HRTFs may need to be converted, in step 108, to fit a coordinate grid used by the actual target sound system. For example, as mentioned, the target 3D sound system can comprise grid points from 180° to −180° at 30° increments in the azimuth plane and from 54° to −36° in 18° increments in the elevational plane. Thus, the coordinate conversion can result in fewer HRTF pairs. Because the grid points of the target system will not necessarily be positioned at the same positions as the original grid points, linear interpolation techniques can be used in step 110 to convert the original HRTF pairs into the target HRTF pairs. Because the HRTFs generate for each grid point are used to generate filter coefficients for the system, the coordinate conversion step 108 is said to result in a filter map for the target system. Each entry in the filter map corresponding to a grid point in the coordinate system.

At this stage a filter set comprising converted, raw data for each individual in the original sample group has been obtained. Starting with the next step 112, the filter sets must be converted to one or more filter sets that are sufficient for use with a large cross section of potential listeners, i.e., the target group Thus, in step 112, various filter sets are generated by averaging the converted filter sets from step 110. For example, the filter sets can be averaged for the entire sample group. If there were, for example, 48 individuals in the sample group, then the 48 filter sets could be averaged for the sample group creating one average filter set. The individuals in the sample group can also be divided along demographic lines and an average filter set for the resulting demographically defined groups can be obtained.

The goal of averaging the filter sets is to develop filter sets that are representative, or semi-representative, of various target demographic groups or for an entire target population, such as the population of the United States. Once the representative filter sets are generated in step 112, the filter sets can be decimated in step 114 to fit the filter engine implemented in the target 3D sound system. For example, if the target 3D sound system uses a 32-tap filter engine, then the average filter sets of step 112 may need to be decimated to fit this filter engine. There are several methods that can be used to perform the decimation in step 114, and the systems and methods described herein are not necessarily tied to any particular method. One exemplary method, however, will be described.

One method for decimating the filter sets is to use Fourier transform techniques and a sliding filter window to select the best cross section of an available filter set. For example, if the filter sets of step 112 comprise 113 taps, then the sliding window can be used to select the best 32-tap cross section of the original 113-tap filter set. Preferably, the best cross section is determined using a minimum mean squared estimation. After decimation, the resulting 32-tap filters can be normalized such that when filter sets are switched as a sound source moves within a 3D environment, the volume level gain is consistent and large variations are avoided. Thus, as the sound object moves, large volume spikes that are audible to the user are avoided and the resulting sound is more realistic for the user.

The next step 116 is to test the resulting decimated filter sets to determine if they accurately represent the intended demographic group or population. The testing preferably verifies that the particular filter set can be used, i.e., it results in an adequate listening experience, for each member of the target group without the need to customize the filter set for any particular member. If the filter set can be used in such a fashion, then the need for complex signal processing to generate filters to be applied in a given 3D sound system can be eliminated.

Implementation of the process of FIG. 1 will reveal that if an adequate sample size for the impulse response measurements are used, then the process will result in adequate filter sets that can be used for each member of a targeted group. Thus, if it is determined in step 118 that the filter sets are not adequate, then the process can revert to step 102 and a larger sample size can be used.

Once the process is tuned so as to produced adequate filter sets, then the complex signal processing of conventional systems can be eliminated, because it is effectively incorporated into the population steps 102–106. Moreover, steps 104 through 114 of the process depicted in FIG. 1 can be implemented in software and the resulting filter sets can be used in a target 3D sound system, thus eliminating the need for a specialized DSP or a particular hardware environment. This is beneficial because the resulting software algorithm will be portable, will not be hardware system intensive, and will not require compression techniques, which are inherently lossy. Therefore, HRTF filters for a particular 3D sound system can be generated just about anywhere and then loaded into the 3D sound system.

Additionally, the coordinate conversion of step 108 can be performed in such a manner as to eliminate the need to include a decimation and interpolation structure in the software algorithm running on a 3D sound system. In other words, in conventional systems a set of HRTF filter coefficients is provided to a 3D sound system. Often, however, the coordinate system used to obtain the coefficients differs from the actual coordinate system of the 3D sound environment associated with the 3D sound system. Therefore, 3D sound system software typically includes algorithms to perform coordinate conversion of the HRTF coefficients. But this adds to the complexity of the system and consumes valuable system resources. Thus, by performing coordinate conversion in step 108, the 3D system software can exclude the decimation and interpolation instructions normally associated with coordinate conversion.

Figure 3:
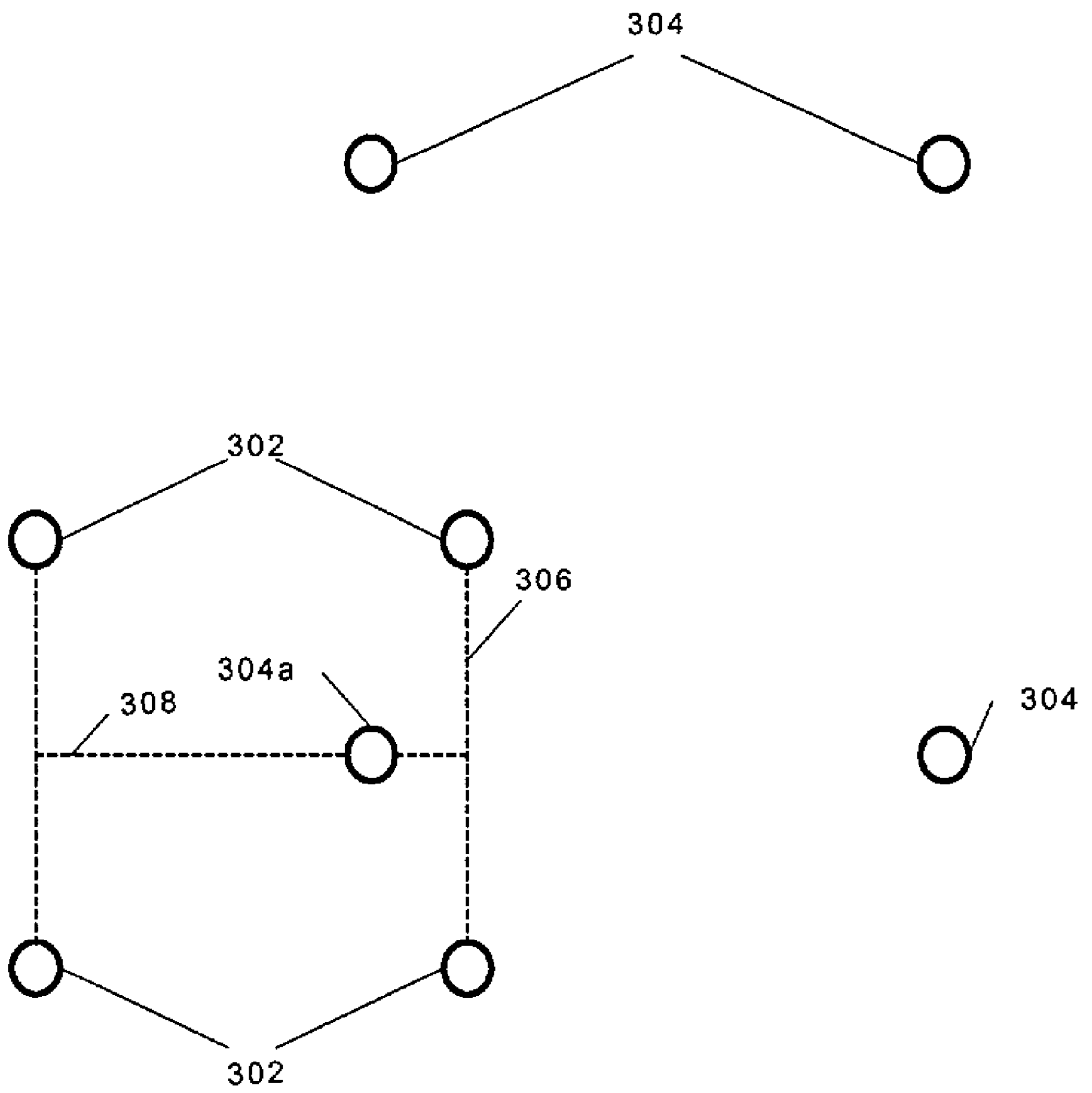
FIG. 3 is a diagram illustrating a method for performing coordinate conversion on HRTF coefficients in accordance with the invention.

FIG. 3 is a diagram illustrating the process of coordinate conversion (step 108). First, data points, or coefficients, are generated for a first coordinate system comprising a plurality of positions of which positions 302 are present as illustrative examples. These coefficients would be generated for positions 302 that are separated, for example, by predetermined angles in the azimuth and elevational planes as described above. But the actual 3D sound system may use a second coordinate system comprising coefficients for a different set of positions of which positions 304 are present as illustrative examples. Thus, the coefficients corresponding to positions 302 must be converted (step 108) to the coordinate system comprising positions 304.

In one embodiment, linear interpolation of the coefficients for positions 302 is used to generate coefficients for positions 304. Thus, linear interpolation of the coefficients for positions 302 along the elevational plane 306 and the azimuth plane 308 is performed to get coefficients for position 304*a*. In this manner, coordinate conversion can be performed on the original coefficients 302 in order to generate a set of coefficients 304 for use with a particular 3D sound system.

Referring again to FIG. 1, if verification of the filter set determines in step 118 that the filter set produces adequate sound for the entire target group, then the process is finished. If, on the other hand, the filter sets cannot be verified to produce adequate sound for the entire target group, then the process can revert to step 102 and the process can be repeated after appropriate parameter adjustments are made; however, once the process is tuned in such a manner, a portable, efficient, non-resource intensive software algorithm can be developed to implement steps 104 through 114.

Figure 2:
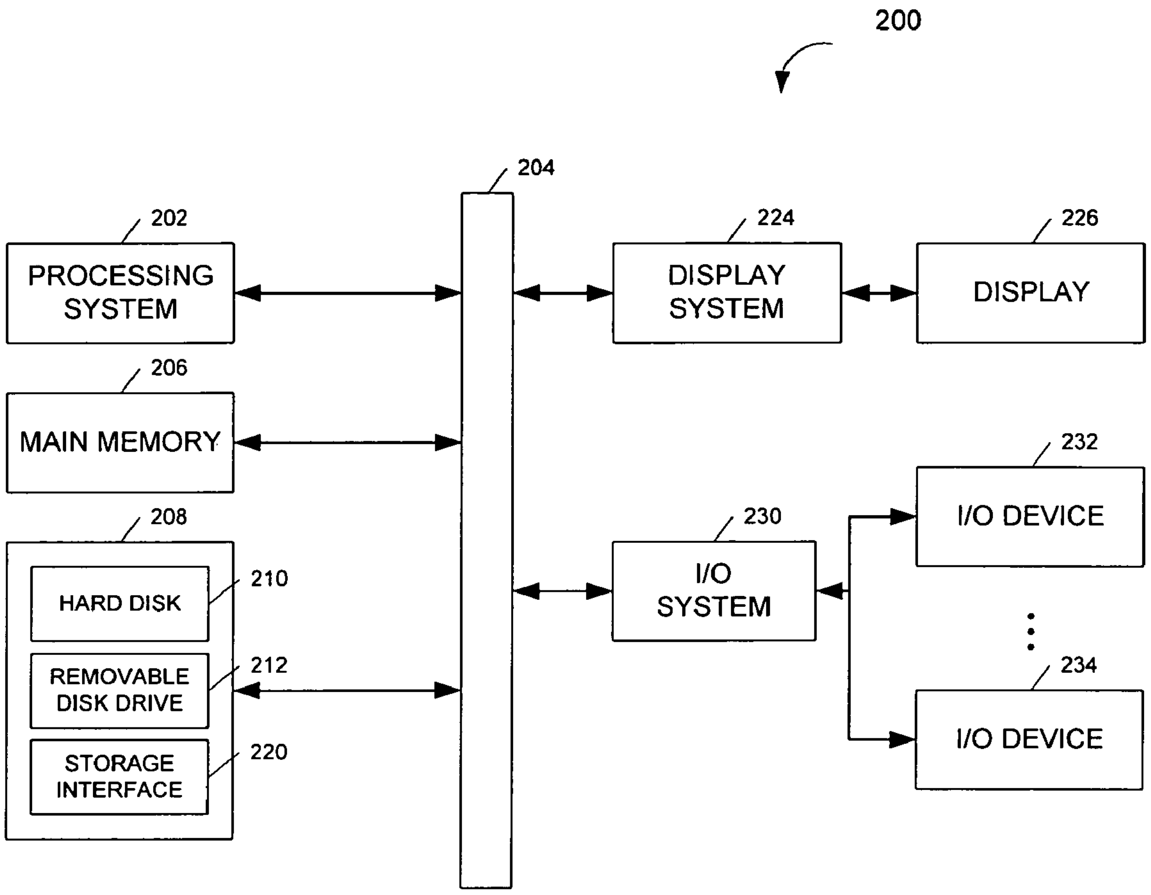
FIG. 2 is a block diagram illustrating an exemplary computer system that can be used to implement the method of FIG. 1.

FIG. 2 is a block diagram illustrating an example computer in which a software algorithm configured to implement steps 104 to 114 can be stored and run. After reading this description, however, it will become apparent how to implement the invention using other computer systems and/or computer architectures. As such, computer system 200 is shown for illustration purposes only and is not intended to limit the invention to any particular hardware platform, configuration, or architecture.

Computer system 200 includes a processing system 202, which controls computer system 200. Processing system 202 includes a central processing unit such as a microprocessor or microcontroller for executing programs, performing data manipulations, and controlling tasks in computer system 200. Moreover, processing system 202 can include one or more additional processors. Such additional processors can include an auxiliary processor to manage input/output, an auxiliary processor to perform floating point mathematical operations, a digital signal processor (DSP) (a special-purpose microprocessor having an architecture suitable for fast execution of signal processing algorithms), a back-end processor (a slave processor subordinate to the main processing system), an additional microprocessor or controller for dual or multiple processor systems, and/or a coprocessor. It will be recognized that these additional processors may be discrete processors or may be built in to the central processing unit.

Processing system 202 is coupled with a communication bus 204, which includes a data channel for facilitating information transfer between storage and other peripheral components of computer system 200. Communication bus 204 provides the set of signals required for communication with processing system 202, including a data bus, address bus, and control bus. Communication bus 204 can comprise any known bus architecture according to promulgated standards. These bus architectures include, for example, industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, IEEE P1394, Universal Serial Bus (USB), Access.bus, Apple Desktop Bus (ADB), Concentration Highway Interface (CHI), Fire Wire, Geo Port, or Small Computer Systems Interface (SCSI).

Computer system 200 includes a main memory 206 and may also include a secondary memory 208. Main memory 206 provides storage of instructions and data for programs to be executed on processing system 202, e.g., a software program configured to implement steps 104 to 114. Main memory 206 is typically semiconductor-based memory such as dynamic random access memory (DRAM) and/or static random access memory (SRAM). Other semiconductor-based memory types include, for example, synchronous dynamic random access memory (SDRAM), Rambus dynamic random access memory (RDRAM), and ferroelectric random access memory (FRAM).

Secondary memory 208 provides storage of instructions and data that are loaded into main memory 206. Secondary memory 208 can be read-only memory or read/write memory and can include semiconductor based memory and/or non-semiconductor based memory. Secondary memory 208 can also include, for example, a hard disk drive 210 and/or a removable storage drive 212.

Such a removable storage drive 212 can represent various non-semiconductor based memories, including but not limited to a floppy disk drive, a magnetic tape drive, an optical disk drive, etc. A removable storage drive 212 reads from and/or writes to a removable storage unit (not shown), such as a magnetic tape, floppy disk, hard disk, laser disk, compact disc, digital versatile disk, etc., in a well-known manner. As will be appreciated, such a removable storage unit (not shown) includes a computer usable storage medium having stored therein computer software and/or data.

Alternatively, secondary memory 208 can include other similar means for allowing computer programs or other instructions to be loaded into computer system 200. Such means may include, for example, a removable storage unit (not shown) and an interface 220. Examples of such include semiconductor-based memory such as programmable read-only memory (PROM), erasable programmable read-only memory (EPROM), electrically erasable read-only memory (EEPROM), or flash memory (block oriented memory similar to EEPROM). Also included are any other removable storage units and interfaces, which allow software and data to be transferred from the removable storage unit to the computer system 200.

Computer system 200 can further include a display system 224 for connecting to a display device 226. Display system 224 can comprise a video display adapter having all of the components for driving display device 226, including video random access memory (VRAM), buffer, and graphics engine as desired. Display device 226 can comprise a cathode ray-tube (CRT) type display such as a monitor or television, or can comprise alternative display technologies such as a liquid-crystal display (LCD), a light-emitting diode (LED) display, or a gas or plasma display.

Computer system 200 further includes an input/output (I/O) system 230 for connecting to one or more I/O devices 232–234. Input/output system 230 can comprise one or more controllers or adapters for providing interface functions between one or more of I/O devices 232–234. For example, input/output system 230 may comprise a serial port, parallel port, infrared port, network adapter, printer adapter, radio-frequency (RF) communications adapter, universal asynchronous receiver-transmitter (UART) port, etc., for interfacing between corresponding I/O devices such as a mouse, joystick, trackball, trackpad, trackstick, infrared transducers, printer, modem, RF modem, bar code reader, charge-coupled device (CCD) reader, scanner, compact disc (CD), digital versatile disc (DVD), video capture device, touch screen, stylus, electroacoustic transducer, microphone, speaker, etc.

Input/output system 230, plus one or more of the I/O devices 232–234, provide a communications interface, which allows software and data to be transferred between computer system 200 and external devices, networks or information sources. Examples of this communications interface include a network interface (such as an Ethernet card), a communications port, a PCMCIA slot and card, etc. This communications interface preferably implements industry promulgated architecture standards, such as Recommended Standard 232 (RS-232) promulgated by the Electrical Industries Association, Infrared Data Association (IrDA) standards, Ethernet IEEE 802 standards (e.g., IEEE 802.11 for wireless networks), Fibre Channel, digital subscriber line (DSL), asymmetric digital subscriber line (ADSL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), Data Over Cable Service Interface Specification (DOCSIS), and so on.

Software and data transferred via this communications interface are in the form of signals, which can be electronic, electromagnetic, optical or other signals capable of being received by this communications interface Computer programming instructions (also known as computer programs, software algorithms, or code) are stored in main memory 206 and/or the secondary memory 208. Such computer programs, when executed, enable computer system 200 to perform the features of the present invention as discussed herein. In particular, the computer programs, when executed, enable processing system 202 to perform the features and functions of the present invention. Accordingly, such computer programs represent controllers of computer system 200.

As used herein, the term "computer readable medium" refers to any media used to provide one or more sequences of one or more instructions to processing system 202 for execution. Non-limiting examples of these media include the removable storage units discussed previously, a hard disk installed in hard disk drive 210, a ROM installed in computer system 200, and signals 242. These computer readable media are means for providing programming instructions to computer system 200.

The systems and methods described herein are equally applicable to PDAs, laptops or other handheld computers, non-portable computers, or any other computer system with sufficient resources to perform the functions described herein.

Thus, by implementing the process illustrated in FIG. 1 on a system such as system 200, for example, much of the problems associated with HRTF generation in conventional 3D sound systems can be overcome. In particular, generation of a set of HRTFs can be reduced to a software algorithm executable on any computer system. This not only makes generating the HRTFs easier, less costly, and more efficient, but it also eliminates the need for complex signal processing within the actual 3D sound system. As a result, 3D sound systems can be designed that are faster an produce better quality sound, with less processing overhead and at lower implementation costs.

While embodiments and implementations of the invention have been shown and described, it should be apparent that many more embodiments and implementations are within the scope of the invention. Accordingly, the invention is not to be restricted, except in light of the claims and their equivalents.

What is claimed is:

1. A method for generating a head related transfer function, comprising:

downconverting each of a plurality of measured impulse responses from a first sampling frequency to a second sampling frequency;

converting each downconverted impulse responses to a set of head related transfer functions;

performing coordinate conversion on each set of head related transfer functions;

averaging the converted sets of head related transfer functions to generate one average set of head related transfer functions; and decimating the average set of head related transfer functions to fit a filter engine of a target system.

2. The method of claim 1, wherein converting each downconverted impulse responses to a set of head related transfer functions comprises generating a pair of head related transfer functions from the measured impulse responses for each grid point in a coordinate system.

3. The method of claim 2, wherein performing coordinate conversion on each set of head related transfer functions comprises performing coordinate conversion on the sets of head related transfer functions, and wherein performing coordinate conversion on the sets of head related transfer functions includes performing linear interpolation on the sets of head related transfer functions.

4. The method of claim 1, further comprising dividing the converted sets of head related transfer functions into demographically defined groups and generating an average set of head related transfer functions for each group.

5. The method of claim 1, wherein decimating the average set of head related transfer functions includes using Fourier transform techniques and a sliding filter window.

6. The method of claim 5, wherein decimating the average set of head related transfer functions further includes using a minimum mean squared estimation.

7. The method of claim 1, further comprising normalizing the decimated average set of head related transfer functions.

8. A computer readable medium having stored thereon one or more sequences of instructions for causing one or more processors to perform steps for generating a head related transfer function, the steps comprising:

downconverting each of a plurality of measured impulse responses from a first sampling frequency to a second sampling frequency;

converting each downconverted impulse responses to a set of head related transfer functions;

performing coordinate conversion on each set of head related transfer functions;

averaging the converted sets of head related transfer functions to generate one average set of head related transfer functions; and decimating the average set of head related transfer functions to fit a filter engine of a target system.

9. The computer readable medium of claim 8, wherein converting each downconverted impulse responses to a set of head related transfer functions comprises generating a pair of head related transfer functions from the measured impulse responses for each grid point in a coordinate system.

10. The computer readable medium of claim 9, wherein performing coordinate conversion on each set of head related transfer functions comprises performing coordinate conversion on the sets of head related transfer functions, and wherein performing coordinate conversion on the sets of head related transfer functions includes performing linear interpolation conversion on the sets of head related transfer functions.

11. The computer readable medium of claim 8, further comprising the step of dividing the converted sets of head related transfer functions into demographically defined groups and generating an average sets of head related transfer functions for each group.

12. The computer readable medium of claim 8, wherein decimating the average set of head related transfer functions includes using Fourier transform techniques and a sliding filter window.

13. The computer readable medium of claim 12, wherein decimating the average sets of head related transfer functions further includes using a minimum mean squared estimation.

14. The computer readable medium of claim 8, further comprising the step of normalizing the decimated average sets of head related transfer functions.

* * * * *